United States Patent [19]
Hagerty

[11] Patent Number: 5,625,320
[45] Date of Patent: Apr. 29, 1997

[54] DIFFERENTIAL PREAMPLIFIER AND PRE-EMPHASIS NETWORK

[75] Inventor: James D. Hagerty, Tiverton, R.I.

[73] Assignee: The United States of America as represented by the Secretary of the Navy, Washington, D.C.

[21] Appl. No.: 319,688

[22] Filed: Oct. 7, 1994

[51] Int. Cl.$^6$ .................. H03F 3/45; H04B 11/00
[52] U.S. Cl. .................. 330/2; 330/69; 330/84; 330/260; 330/298; 330/306; 367/131; 367/134; 367/135; 367/901
[58] Field of Search .................. 330/69, 84, 258, 330/259, 260, 306, 2, 298, 207 P; 367/131, 134, 135, 901

[56] References Cited

U.S. PATENT DOCUMENTS

| | | | |
|---|---|---|---|
| 3,939,468 | 2/1976 | Mastin | 367/65 X |
| 4,242,741 | 12/1980 | Parrish | 330/84 X |
| 4,320,351 | 3/1982 | Brown, Jr. et al. | 330/260 |
| 4,679,002 | 7/1987 | Sherwin et al. | 330/306 X |
| 5,300,896 | 4/1994 | Suesserman | 330/260 |

Primary Examiner—James B. Mullins
Attorney, Agent, or Firm—Michael J. McGowan; James M. Kasischke; Prithvi C. Lall

[57] ABSTRACT

A preamplifier and pre-emphasis network is provided having a differential amplifier exhibiting common mode noise rejection. The preamplifier is particularly suited for use with a double-sided sensor element and it includes a double-sided, balanced calibration circuit. First and second variable gain buffers are joined to the differential amplifier for preventing current noise degradation at the differential amplifier inputs. A pre-emphasis network is further provided in conjunction with the variable gain buffers for providing balanced differential gain of the sensor element signal. Further elements of the invention provide for high and low pass filtering, and differential buffering of the output signal.

13 Claims, 2 Drawing Sheets

5,625,320

DIFFERENTIAL PREAMPLIFIER AND PRE-EMPHASIS NETWORK

STATEMENT OF GOVERNMENT INTEREST

The invention may be used by and on behalf of the Government of the United States without the payment of any royalties thereon or therefor.

CROSS-REFERENCE TO RELATED APPLICATIONS

This invention is related to co-pending application entitled BALANCED, DOUBLE SIDED CALIBRATION CIRCUIT FOR DIFFERENTIAL PREAMPLIFIER, Ser. No. 08/319,709, now U.S. Pat. No. 5,477,504, (Navy Case No. 73344) of the same inventive entity as herein, filed on even date herewith and fully incorporated herein by reference.

BACKGROUND OF THE INVENTION (1) Field of the Invention

This invention is directed to the field of amplifier circuits, and more particularly, to a differential sensor element preamplifier.

(2) Description of the Prior Art

When utilizing sensor elements to detect and measure sea noise, low noise circuits are desirable for measuring ambient sea noise levels. For many years, hydrophone preamplifiers with a single-ended input have been used for various applications because of the ease of obtaining the desired very low noise floor at the input. These amplifier circuits usually employ very low-noise FET's (Field Effect Transistors) to give an ultra-high input impedance that avoids generating current noise problems when terminated with an input resistor of many megohms. Such amplifier circuits have been used successfully.

A disadvantage with single-ended type sensors such as hydrophones is the susceptibility to pickup and amplification of capacitively-coupled noise such as that at sixty hertz. This problem becomes most obvious when using long hydrophone cables. Such input noise pickup degrades the signal-to-noise ratio in the most sensitive portion (lowest signal level) of the entire system. Often, the benefits of using low-noise devices are destroyed by capacitively-coupled input noise.

Differential-input amplifiers solve this problem because they cancel out common-mode noise at the amplifier input. In general, the use of differential-input amplifiers for hydrophones has been limited until now because of the difficulty in calibrating them. This problem has been solved, and reference may be had in this connection to co-pending U.S. patent application entitled "Balanced, Double-Sided Calibration Circuit For Differential Preamplifier" of the same inventive entity as herein and fully incorporated herein by reference.

Other past difficulties with differential amplifiers have been in obtaining a noise floor comparable to that of discrete FETs, as well as the problem of saturating the first stage of the differential amplifiers with cable strumming noise and noise from mechanical sources, such as motor, machinery and tool transients. It has been difficult to provide precision balanced filtering at the very front end that would attenuate these low-frequency noise sources while maintaining common-mode input rejection. The first stage is especially vulnerable to saturation because it commonly has high gain to preserve the noise floor.

One prior art hydrophone preamplifier with self-calibration disclosed in U.S. Pat. No. 4,689,578 to Spychalski, includes two charge-coupled amplifier stages forming a differential preamplifier, two first order high pass filters providing low frequency roll off and a fully differential output driver. A pair of back-to-back diodes is connected directly across the hydrophone.

In the device disclosed by Spychalski, diodes regulate the current to the charge-coupled amplifiers. If, however, the hydrophone charges to too high a level, the unprotected diodes can fail causing the differential preamplifier to become saturated or damaged due to the resulting voltage spike.

In the Spychalski device, the roll off frequency of the two first order high pass filters is adjustable by a frequency control signal that changes the time constants of the filters. The gain of the amplifiers can be set by feedback capacitors. The gain of the preamplifier can be set by a gain change signal. The preamplifier is balanced for common-mode noise rejection by a trim capacitor. For each setting, and for each change in the settings of the gain and of the roll off frequency, the preamplifier needs to be checked for unbalance. Not only is this disadvantageous, insofar as each different setting requires another re-balance process, but more importantly, it is inherently labor-intensive to set and to maintain precision balance by means of varying the value of a trim capacitor. Trim capacitors can also age and drift with time and temperature excursions, necessitating frequent re-adjustment.

SUMMARY OF THE INVENTION

It is accordingly the principal object of the present invention to provide a differential sensor element preamplifier with a balanced, differential pre-emphasis network that always provides common-mode noise rejection for different settings of its roll off frequency and that is protected against diode failure-induced saturation and input damage.

A preamplifier and pre-emphasis network is provided having a differential amplifier exhibiting common-mode noise rejection. The preamplifier is particularly suited for use with a double sided sensor element. First and second variable gain buffers are joined to the differential amplifier for preventing current noise degradation at the differential amplifier inputs. A pre-emphasis network is further provided in conjunction with the variable gain buffers for providing balanced differential gain of the sensor element signal. Further elements of the invention provide for high and low pass filtering and buffering of the output signal.

A hydrophone element is connected across the inputs of the first and second variable gain buffers of high input impedance. Balanced first and second differential pre-emphasis networks are respectively connected to each of the variable gain buffers for providing balanced, differential gain of the hydrophone signal coupled across the inputs of the first and second high input impedance buffers such that comparatively low-frequency hydrophone signal components are amplified less than comparatively high-frequency components of the hydrophone signal.

In accordance with one aspect of the present invention, the disclosed pre-emphasis network includes matched resistor/capacitor (R/C) networks having precision, one (1) percent, NPO capacitors and 1% resistors which are connected in a feedback loop around each of the variable gain buffers. The values of the capacitors and resistors of the balanced R/C networks may be set to provide different selected gains for high and low frequency components thereby serving to select a particular filter roll off frequency while maintaining common-mode noise rejection at all operating frequencies.

In accordance with another aspect of the present invention, the first and second buffers of high input impedance are driven by bipolar voltage supplies. First and second balanced surge protecting networks, connected to each input of the first and second buffers respectively, prevent saturation and input damage of the preamplifier by hydrophone voltage spikes. In the preferred embodiment, the surge-protecting networks include a current-limiting resistor and back-to-back pairs of reversed-polarity diodes connected to the bi-polar voltage rails of the buffers. The resistors protect the diodes against current damage and the diodes clamp at the voltage of the rails of the first and second buffers, thereby protecting the preamplifier against transient-induced over voltage damage at the inputs.

BRIEF DESCRIPTION OF THE DRAWINGS

These and other objects and aspects of the present invention will become apparent as the invention becomes better understood by referring to the following detailed description of the preferred embodiment, and to the drawings, wherein.

DESCRIPTION OF THE PREFERRED EMBODIMENT

Figure 1:
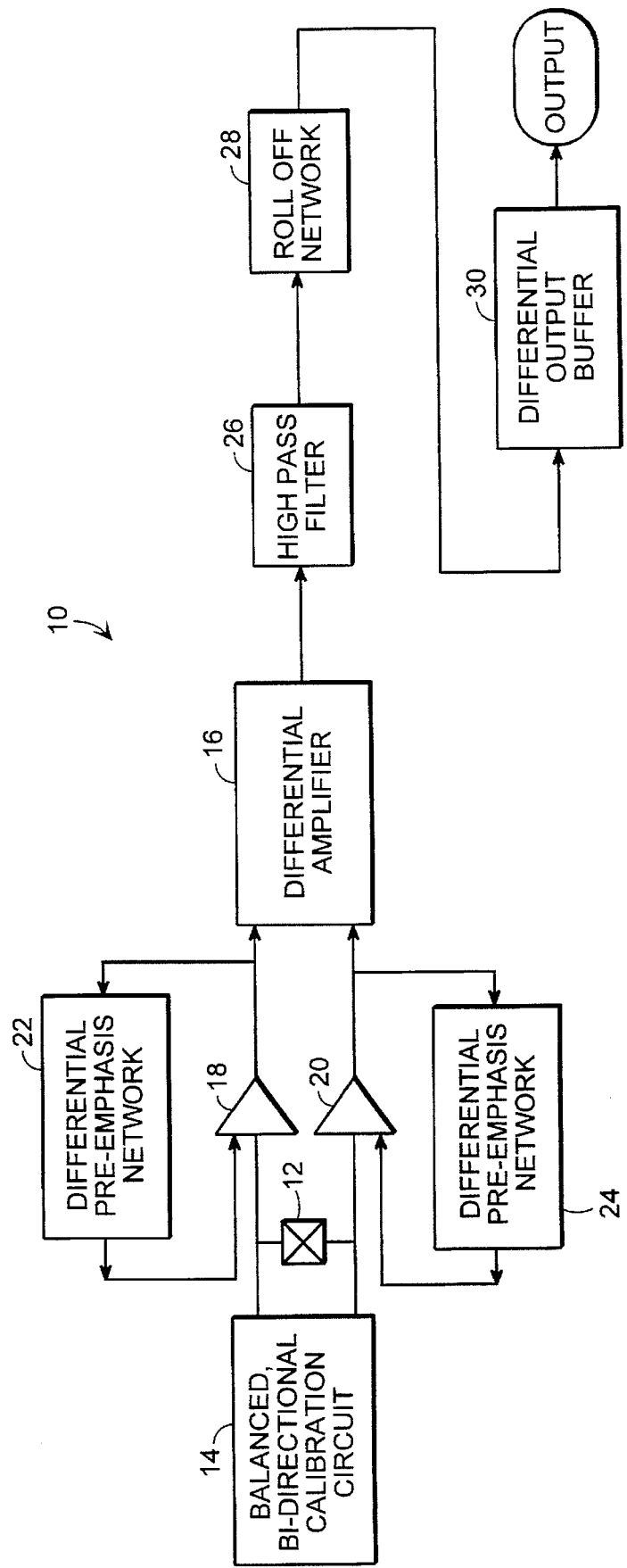
FIG. 1 is a block diagram of the differential sensor element preamplifier with a balanced, differential pre-emphasis network in accordance with the present invention.

Referring now to FIG. 1, generally designated at 10 is a block diagram of the differential preamplifier with a balanced, differential pre-emphasis network in accordance with the present invention. The block diagram 10 includes a sensor element 12 such as a hydrophone differentially coupled to a balanced, bidirectional calibration circuit 14 and a differential amplifier 16 via low-noise voltage amplifiers 18, 20 of variable gain and high input impedance. The voltage amplifiers 18, 20 act as variable gain buffers which prevent current noise degradation of the differential amplifier 55.

The balanced, bi-directional calibration circuit 14 is employed initially during circuit set up. It enables checking of the continuity of the sensor 12 in both directions, and enables the user to check the balance of the preamplifier input circuitry. When system calibration is completed, the calibration circuit 14 is switched out of the network and rendered electrically transparent to the differential input hydrophone amplifier 16. Reference may be had to the above-identified and incorporated co-pending U.S. utility patent application for a full and complete description of the operation of the balanced, bi-directional calibration circuit 14.

Balanced, differential pre-emphasis networks 22, 24 are connected in a feedback loop about the voltage amplifiers 18, 20 respectively. The pre-emphasis networks 22, 24 set the gain of the variable gain voltage amplifiers 18, 20 to impart comparatively more gain to high frequency sensor signal components than to lower frequency components, and thereby serve to filter out low-frequency noise at a set roll off frequency. The differential gain of the voltage amplifiers 18, 20 can be set to a wide range of practical levels, and the differential amplifier 16 provides common-mode noise rejection at all frequencies of operation.

The signal from the differential amplifier 16 is fed to a conventional active high-pass filter 26 with gain stage. The signal output from the high-pass filter 26 is provided to a roll off network 28. The high-pass filter 26 provides additional low frequency roll off, as does the roll off network 28. The two stages 26, 28 allow flexibility in gain and frequency shaping.

The signal from the roll off network 28 is fed to a differential output buffer 30. This output stage can be used to drive long balanced-wire cables or an isolation transformer without oscillation.

Figure 2:
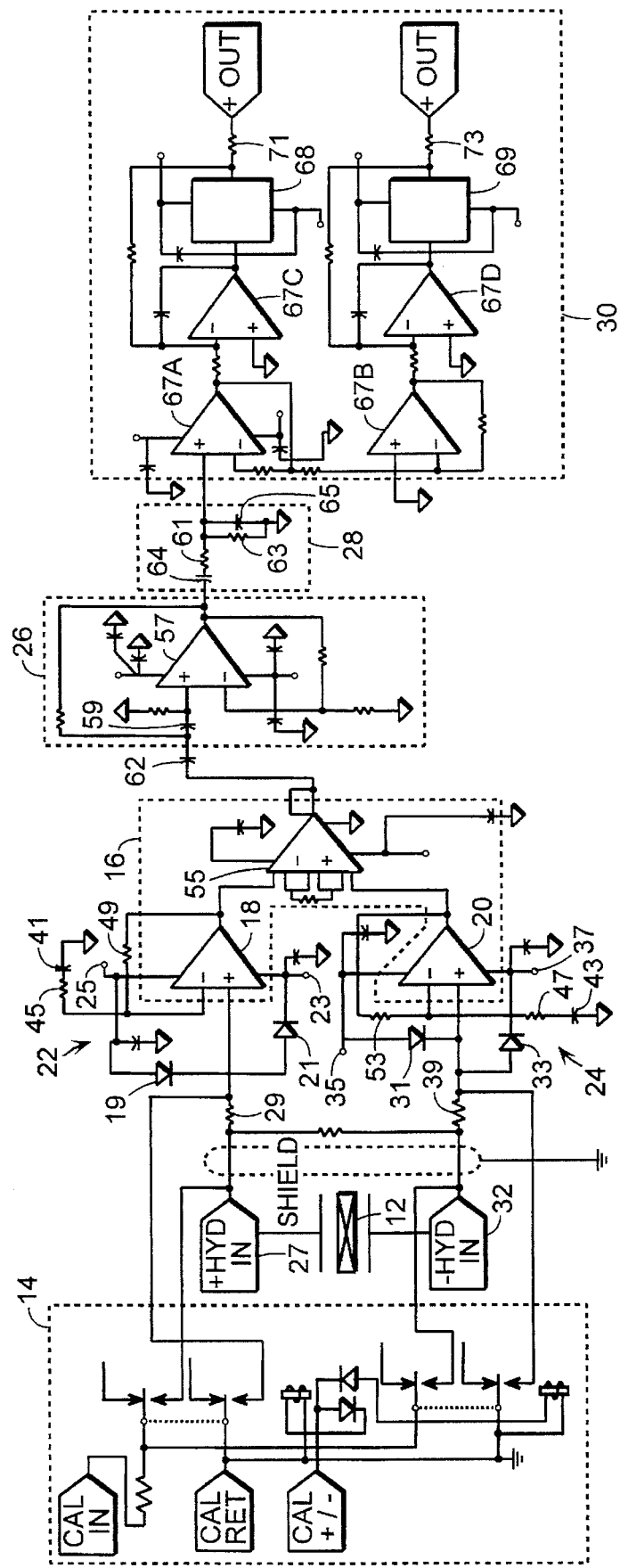
FIG. 2 is a schematic circuit diagram of the differential sensor element preamplifier with a balanced, differential pre-emphasis network of the present invention.

Referring now to FIG. 2, there is shown a circuit diagram of a preferred embodiment of the invention. In FIG. 2 dashed lines are used to represent the functional blocks of FIG. 1 and have corresponding reference numbers. The differential pre-emphasis networks 22, 24 filter out low-frequency mechanical noise to attenuate transients which might induce amplifier saturation. Reversed-polarity, back-to-back low-noise diodes 19 and 21 are coupled to the voltage rails 23, 25 of the voltage amplifier 18 and to one side 27 of the sensor 12 via surge protection resistor 29. On the other side of sensor 12, reversed-polarity back-to-back low-noise diodes 31 and 33 are coupled to the voltage rails 35, 37 of the voltage amplifier 20 and to the other input 32 of the hydrophone 12 via surge protecting resistor 39. The networks 22 and 24 protect the inputs of the amplifiers 18 and 20 from voltage transients induced across the sensor 12. Surge protection resistors 29, 39, respectively provide current protection to the diodes 19, 21 and 31, 33. The diodes 19, 21 and 31, 33 clamp any voltage transients to the voltage rails 23, 25, 35, 37 of the amplifiers 18, 20 should the transients turn one of the diodes on by exceeding the rail voltage by the amount of the voltage drop across the diode, typically 0.7 volts. Voltage amplifiers 18 and 20 can be the Analog Devices AD 743 or the like.

The balanced, differential pre-emphasis networks 22, 24 enable the setting of the low frequency roll off and the balancing of the differential amplifier 16 to preserve common-mode noise rejection at the roll off frequency. Typically, the roll off frequency will be in the range of approximately 1 Hz to 800 Hz. At low frequencies, the capacitors 41, 43 of the network 22, 24 act as open circuits so that the low frequency components of the hydrophone signal go through the voltage amplifiers 18 and 20 with unity gain.

At higher frequencies, capacitors 41, 43 act as short circuits, and in the preferred embodiment, the higher frequency components of the hydrophone signal pass through the voltage amplifiers 18, 20 with a gain of two or greater. This differential pre-emphasis provided by the networks 22, 24 acts to filter frequencies lower than the effective roll off frequency out of the hydrophone output signal.

The roll off (−3 dB) frequencies of networks 22 and 24 can be set according to the following criteria. The high frequency gains of amplifiers 18 and 20 are first set by calculating convenient values for resistors 49, 45, 53 and 47. The high-frequency gain is equal to the ratio of resistor 49 to resistor 45 plus one or the ratio of resistor 53 to resistor 47 plus one. Both gains are set to be equal. The corner (−3 dB) frequency of networks 22 and 24 will then be equal to $$f = \frac{1}{(2\pi \times R_1 \times C_1)} \text{ or } f = \frac{1}{(2\pi \times R_2 \times C_2)}$$

where $R_1$ is the value of resistor 45, $C_1$ is the value of capacitor 41, $R_2$ is the value of resistor 47 and $C_2$ is the value of capacitor 43.

Because of this circuit architecture, the roll off frequencies and differential gain of the two networks can be adjusted without affecting the input impedance of the buffers. This is an advantage over the prior art because it preserves the constant, high-impedance load that affects the hydrophone.

The break frequencies of pre-emphasis networks 45, 41, 47 and 43 are set to 335 Hz in the preferred embodiment but are easily shifted up or down by adjusting resistors 45 and 47 so long as tight balance and close component matching between both sides of the circuit is maintained. Capacitors 41 and 43 must be matched to within one percent, and are preferably ceramic temperature-compensated types for minimum temperature drift. Such precision components are available from manufacturers such as AVX and Republic. Resistors 45, 49, 53 and 47 are one percent metal-film types. Such close matching is crucial in maintaining circuit balance for common-mode noise rejection at the differential input of the preamplifier 16.

The differential amplifier 16 is preferably implemented as a commercially available Burr-Brown IA103, although other instrumentation amplifiers may be chosen with comparable low-noise performance, which is typically about negative one hundred sixty-seven decibels referenced to one volt per root-hertz at thirty kilohertz.

The input of the differential amplifier 16 is bi-polar and is buffered with the voltage amplifiers 18, 20 (FET-Input Devices) to avoid producing current noise. The gain of amplifier 16 is set at twenty dB in the preferred embodiment as a compromise between maintaining the noise floor and avoiding saturation. If saturation is not a problem, it may be set for as high as forty dB of gain.

Amplifier 16 is followed by a conventional active high-pass filter with gain stage 26. High-pass filter 26 utilizes an operational amplifier 57 coupled with capacitors 59 and 62 to provide extra low frequency roll off by the response of the op amp 57. Op amp 57 can be an Analog Devices AD 743 or the like. The gain of op amp stage 26 is preferably set at twenty dB, but may be tailored by the user. Roll off network 28 comprises a network of resistors 61, 63 and capacitors 64, 65. The roll off network 28 gives the user great flexibility in gain/break frequency shaping. This is the same R/C network used in earlier preamplifier designs and is well known to those skilled in the art and included here for completeness and continuity.

The differential output buffer 30 comprises amplifiers 67A, 67B, 67C and 67D buffers 68 and 69. It can be used to drive long cables or isolation transformers without oscillation. Amplifier 67A is non-inverting while amplifier 67B is inverting. Amplifiers 67A, 67B, 67C and 67D preferably are an Analog Devices AD 713 quad op amp operated as a differential converter. These amplifiers 67A, 67B cooperate to convert the single-ended output signal of the preamplifier 16 into two out-of-phase signals with the same gain. Amplifiers 67C and 67D are connected in feedback loops respectively with output buffers 68 and 69. Buffers 68 and 69 are preferably very high loop stability output buffer/drivers such as the Linear Technology 1010 or the like. Resistors 71 and 73 are added to each output leg to give extra isolation from reactive loads, as well as extra overload protection.

Accordingly, the present invention provides a novel differential hydrophone preamplifier with a balanced, differential pre-emphasis network which preserves common-mode noise rejection while allowing adjustable, high pass "prewhitening" of the hydrophone signal.

Many modifications of the presently disclosed invention will become apparent to those of skill in the art without departing from the scope of the appended claims.

What is claimed is:

1. A pre-amplifier and pre-emphasis network, comprising:

a differential amplifier having first and second differential inputs and one output and exhibiting common-mode noise rejection at the differential inputs;

first and second variable gain buffers of high input impedance and low noise floor, each of said first and second variable gain buffers having an input and an output, each output of said first and second variable gain buffers connected to a respective one of said first and second differential inputs of said differential amplifier for preventing current noise degradation at said first and second differential inputs of said differential amplifier;

first and second differential pre-emphasis networks, each first and second differential pre-emphasis network connected to a respective one of the first and second variable gain buffers of high input impedance, for providing balanced, differential gain of a sensor element signal coupled across the inputs of the first and second variable gain buffers such that comparatively lower frequency components of the sensor element signal are amplified less than comparatively higher frequency components;

a high pass filter having an input coupled to said one output of said differential amplifier, and an output;

a roll-off network having an input coupled to said output of said high-pass filter, and an output; and a differential output buffer having an input coupled to said output of said roll-off network, and first and second outputs for providing inverted and non-inverted signals.

2. The network of claim 1 further comprising a two-sided sensor element having one side joined to said first variable gain buffer and a second side joined to said second variable gain buffer.

3. The network of claim 2 wherein said sensor element comprises a hydrophone.

4. The network of claim 2 further including a balanced calibration circuit coupled to one side of said two-sided sensor element.

5. The network of claim 4 wherein said balanced calibration circuit is bi-directional.

6. The network of claim 4 wherein said balanced calibration circuit is electrically transparent to said preamplifier and preemphasis network when said balanced calibration circuit is not in use.

7. The network of claim 1 wherein said first and second variable gain buffers comprise voltage amplifiers having inverting and non-inverting inputs and an output.

8. The network of claim 7 wherein each of said first and second differential pre-emphasis networks comprises a series resistor/capacitor network connected from the inverting input of said respective variable gain buffer to ground, said resistor/capacitor network values being selected to provide a predetermined low frequency.

9. The network of claim 8 wherein each of said first and second differential pre-emphasis networks further includes a feedback resistor connected between each said variable gain buffer output and each said buffer inverting input, said resistors having equal value to preserve circuit balance.

10. The network of claim 1 wherein said first and second variable gain buffers and said first and second differential pre-emphasis networks have equal impedances to preserve circuit balance.

11. The network of claim 1 wherein said high-pass filter includes an amplifier providing a pre-determined gain.

12. The network of claim 1 wherein said roll-off network includes a resistor/capacitor network.

13. The network of claim 1 further comprising first and second surge protecting networks respectively connected to each input of said first and second variable gain buffers, for preventing over-voltage damage of the differential amplifier inputs wherein said first and second variable gain buffers are driven by bi-polar voltage rails, each surge protecting network including a current limiting resistor and a pair of reversed-polarity back-to-back diodes connected to said bi-polar voltage rails of a respective one of said first and second variable gain buffers.

* * * * *